(12) United States Patent
Kim et al.

(10) Patent No.: US 12,046,653 B2
(45) Date of Patent: Jul. 23, 2024

(54) INTEGRATED CIRCUIT INCLUDING GATE-ALL-AROUND TRANSISTOR

(71) Applicant: SAMSUNG ELECTRONICS CO., LTD., Suwon-si (KR)

(72) Inventors: Bonyeop Kim, Gwangmyeong-si (KR); Taehyung Kim, Yongin-si (KR); Sangshin Han, Suwon-si (KR); Sangyeop Baeck, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 357 days.

(21) Appl. No.: 17/501,454

(22) Filed: Oct. 14, 2021

(65) Prior Publication Data
US 2022/0140099 A1    May 5, 2022

(30) Foreign Application Priority Data

Nov. 5, 2020  (KR) .................. 10-2020-0147154
Mar. 11, 2021  (KR) .................. 10-2021-0032094

(51) Int. Cl.
*H01L 29/66* (2006.01)
*H01L 27/092* (2006.01)
(Continued)

(52) U.S. Cl.
CPC .... *H01L 29/42392* (2013.01); *H01L 27/0924* (2013.01); *H01L 29/0673* (2013.01); *H10B 10/12* (2023.02)

(58) Field of Classification Search
CPC .......... H01L 29/42392; H01L 27/0924; H01L 29/0673; H01L 2924/00014;
(Continued)

(56) References Cited

U.S. PATENT DOCUMENTS 6,008,821 A * 12/1999 Bright .................... G09G 5/395
                                                                     345/545
6,818,929 B2    11/2004 Tsutsumi et al.
(Continued)

FOREIGN PATENT DOCUMENTS

| JP | 2008-300677 A | 12/2008 |
|---|---|---|
| KR | 10-0526884 B1 | 11/2005 |
| KR | 10-2019-0087752 A | 7/2019 |

*Primary Examiner* — Niki H Nguyen
(74) *Attorney, Agent, or Firm* — Sughrue Mion, PLLC

(57) ABSTRACT

An integrated circuit includes: a memory cell block including a plurality of bitcells; and an input and output (I/O) block including a plurality of gate-all-around (GAA) transistors connected to the bitcells, wherein the I/O block includes a plurality of active regions disposed separately from one another in a first direction, each of which extends in a second direction that is vertical to the first direction, and in which the GAA transistors are formed, a plurality of power rails disposed separately from one another in the first direction, and configured to provide power to the GAA transistors, and a plurality of signal lines disposed between the power rails, and configured to provide signals to the GAA transistors, a first number of bitcells among the bitcells are connected to the GAA transistors formed in a second number of active regions among the active regions, and the second number is twice the first number.

20 Claims, 14 Drawing Sheets

(51) Int. Cl.
*H01L 29/06* (2006.01)
*H01L 29/423* (2006.01)
*H10B 10/00* (2023.01)

(58) Field of Classification Search
CPC ....... H01L 21/823885; H01L 29/78618; H01L 21/76816; H01L 21/76877; H01L 2225/06527; H01L 27/11803; H01L 27/0207; H01L 27/092; H01L 21/823871; H01L 23/528; H01L 23/5226; H01L 21/823821; H01L 25/0657; H01L 27/11807; H01L 23/535; H01L 29/66439; H01L 2225/06541; H01L 29/7827; H01L 24/80; H01L 21/823814; H01L 23/5283; H01L 2924/00; H01L 27/0886; H01L 2027/11875; H01L 27/088; H01L 29/66742; H01L 2924/0002; H01L 23/485; H01L 21/76898; H01L 21/823878; H01L 29/785; H01L 21/823828; H01L 29/0649; H01L 2223/6677; H01L 2224/80895; H01L 2224/80896; H01L 23/66; H01B 10/12; H10B 10/125; H10B 10/00; H10B 41/27; H10B 41/41; H10B 12/00; H10B 43/20; H10B 51/20; H10B 41/10; H10B 53/20; H10B 53/30; H10B 63/80; H10B 41/00; H10B 41/42; H10B 51/30; H10B 53/00; H10B 53/10; H10B 61/00; H10B 12/053; H10B 12/315; H10B 20/38; H10B 53/40; H10B 61/10; H10B 43/40; H10B 43/27; H10B 61/22; H10B 41/35; H10B 43/50; H10B 80/00; H10B 12/20; H10B 12/30; H10B 20/20; H10B 41/50; H10B 61/20; H10B 63/30; H10B 20/34; H10B 41/30; H10B 43/10

See application file for complete search history.

(56) References Cited

U.S. PATENT DOCUMENTS

| | | | |
|---|---|---|---|
| 7,057,963 | B2 | 6/2006 | Yang |
| 10,380,306 | B2 | 8/2019 | Hsieh et al. |
| 2013/0105877 | A1* | 5/2013 | Kim ................ H01L 29/66833 257/314 |
| 2016/0062656 | A1* | 3/2016 | Ramaraju ............ G11C 16/10 711/103 |
| 2016/0172052 | A1* | 6/2016 | Yang ................... G11C 17/12 365/72 |
| 2019/0148407 | A1 | 5/2019 | Guo et al. |
| 2020/0119022 | A1 | 4/2020 | Iwahori |
| 2020/0243502 | A1 | 7/2020 | Kim |
| 2020/0286919 | A1 | 9/2020 | Chou et al. |

* cited by examiner

INTEGRATED CIRCUIT INCLUDING GATE-ALL-AROUND TRANSISTOR

CROSS-REFERENCE TO RELATED APPLICATIONS

This application is based on and claims priority under 35 U.S.C. § 119 to Korean Patent Application No. 10-2020-0147154, filed on Nov. 5, 2020, and 10-2021-0032094, filed on Mar. 11, 2021 in the Korean Intellectual Property Office, the disclosures of which are incorporated by reference herein in their entirety.

BACKGROUND

The disclosure relates to an integrated circuit, and more particularly, to an integrated circuit including a gate-all-around transistor.

In order to enhance price competitiveness of a memory device, it is necessary to reduce the size of a semiconductor element. However, the reduction in size of the semiconductor element may cause a single channel effect. In order to address this, a fin field-effect transistor (FinFET) in which a gate surrounds three sides of a channel has been developed, and furthermore, a gate-all-around (GAA) transistor, such as a nanosheet transistor or a nanowire transistor, in which a gate surrounds four sides of each nanosheet channel has been developed.

Meanwhile, the FinFET may adjust a performance and a size of a memory device including the finFET according to the number of fins, but the GAA transistor requires an increase in the number of nanosheets or nanowires for enhancing a performance of a memory device including the GAA. As the number of nanosheets or nanowires of the GAA transistor increases, the size of the memory device increases, the integration density of a semiconductor device deteriorates, and the price competitiveness is also weakened.

SUMMARY

The disclosure provides an integrated circuit including a gate-all-around (GAA) transistor having high integration density, and a method of designing the same.

According to embodiments, there is provided an integrated circuit including: a memory cell block including a plurality of bitcells; and an input and output (I/O) block including a plurality of GAA transistors connected to the bitcells, wherein the I/O block includes a plurality active regions disposed separately from one another in a first direction, each of which extends in a second direction that is vertical to the first direction, and in which the GAA transistors are formed, a plurality power rails disposed separately from one another in the first direction, and configured to provide power to the GAA transistors, and a plurality signal lines disposed between the power rails, and configured to provide signals to the GAA transistors, a first number of bitcells among the bitcells are connected to the GAA transistors formed in a second number of active regions among the active regions, and the second number is twice the first number.

According to embodiments, there is provided an integrated circuit including: a first number of bitcells disposed in a first direction; and a front-end cell region configured to correspond to the first number of bitcells, and is adjacent to the first number of bitcells in a second direction that is vertical to the first direction, wherein the front-end cell region includes: a second number of active regions separated from one another in the first direction, each of which extends in the second direction; a plurality logic cells including GAA transistors formed in the active regions; and a plurality power rails configured to provide power to the logic cells, wherein the second number is double the first number.

According to embodiments, there is provided an integrated circuit including: a first number of bitcells disposed in a first direction; a second number of active regions separated from one another in the first direction, extending in the second direction that is vertical to the first direction, and configured to correspond to the first number of bitcells; a plurality logic cells including a plurality multi-bridge channel type transistors formed in the second number of active regions; a front-end cell region including a plurality logic cells configured to adjacent to the first number of bitcells in the second direction; a back-end cell region including a plurality logic cells configured to adjacent to the logic cells in the front-end cell region in the second direction; and a plurality power rails separated from one another in the first direction, each of which extends in the second direction and being formed to be discontinued on a boundary between the front-end cell region and the back-end cell region, wherein the second number is double the first number.

BRIEF DESCRIPTION OF DRAWINGS

Embodiments will be more clearly understood from the following detailed description taken in conjunction with the accompanying drawings in which.

DETAILED DESCRIPTION

Figure 1:
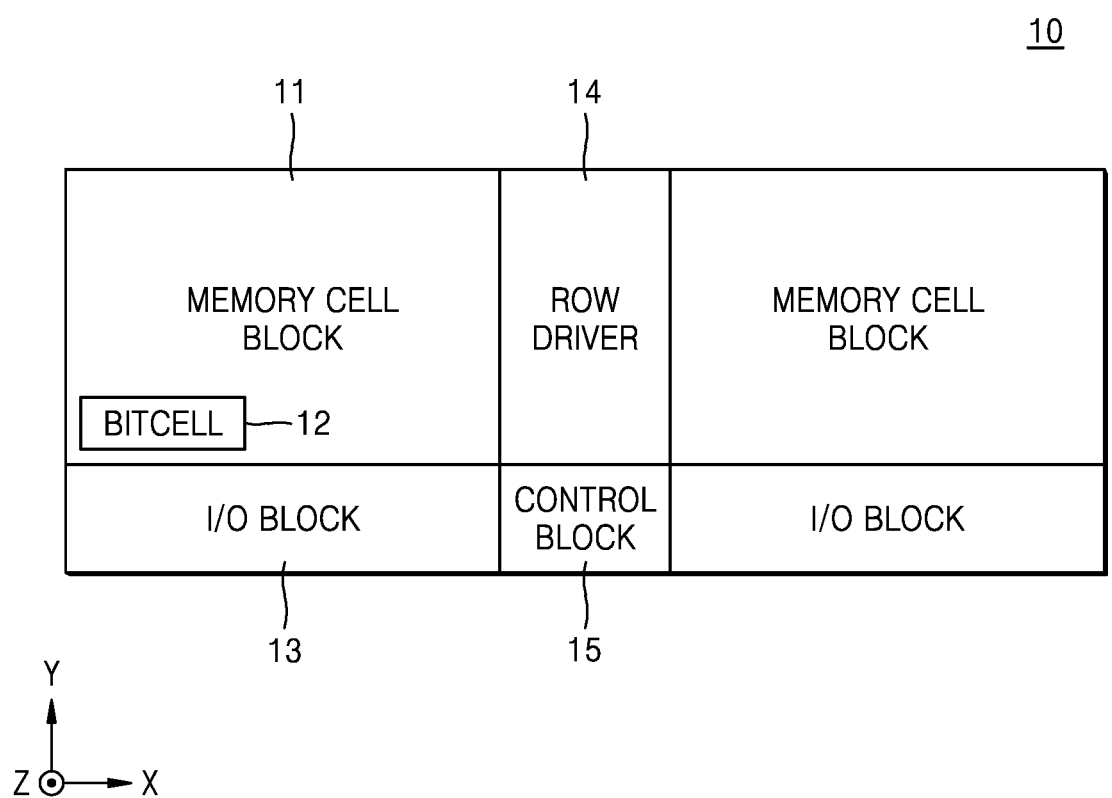
FIG. 1 is a layout diagram of an integrated circuit, according to an embodiment.

Hereinafter, various embodiments will be described with reference to the accompanying drawings. The embodiments described herein are all example embodiments, and thus, the inventive concept is not limited thereto and may be realized in various other forms. Hereinafter, a horizontal direction on the plane in a layout diagram is defined as a first direction X, a vertical direction on the plane in the layout diagram is defined as a second direction Y, and a direction substantially vertical to the layout diagram is defined as a third direction Z. Accordingly, the second direction Y may mean a direction vertical to the first direction X. A direction indicated with an arrow on the drawing and an opposite direction thereto are described as the same direction. The aforementioned definitions of the directions are the same for all the drawings. In the drawings of the specification, for ease of illustration, only some of them may be drawn.

Each of the embodiments provided in the following description is not excluded from being associated with one or more features of another example or another embodiment also provided herein or not provided herein but consistent with the inventive concept. For example, even if matters described in a specific example are not described in a different example thereto, the matters may be understood as being related to or combined with the different example, unless otherwise mentioned in descriptions thereof. In addition, it should be understood that all descriptions of principles, aspects, examples, and specific embodiments are intended to encompass structural and functional equivalents thereof. In addition, these equivalents should be understood as including not only currently well-known equivalents but also equivalents to be developed in the future, that is, all devices invented to perform the same functions regardless of the structures thereof As used herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

It will be understood that when an element or layer is referred to as being "over," "above," "on," "below," "under," "beneath," "connected to" or "coupled to" another element or layer, it can be directly over, above, on, below, under, beneath, connected or coupled to the other element or layer or intervening elements or layers may be present. In contrast, when an element is referred to as being "directly over," "directly above," "directly on," "directly below," "directly under," "directly beneath," "directly connected to" or "directly coupled to" another element or layer, there are no intervening elements or layers present.

FIG. 1 is a layout diagram of an integrated circuit according to an embodiment. In detail, the layout diagram in FIG. 1 shows a memory device 10 included in an integrated circuit. In some embodiments, the integrated circuit may store data on the basis of a command and an address that are externally provided, and the memory device 10 may be a standalone memory device. In addition, in some embodiments, the integrated circuit may further include another element that writes data in or reads data from the memory device 10, and the memory device 10 may be an embedded memory device.

As shown in FIG. 1, the memory device 10 may include memory cell blocks 11, input and output (I/O) blocks 13, a row driver 14, and a control block 15. The memory cell blocks 11 may include a plurality of bitcells 12 respectively accessed by word lines and bitlines. In some embodiments, the bitcells 12 may be volatile memory cells such as static random access memory (SRAM) cells or dynamic random access memory (DRAM) cells. In some embodiments, the bitcells 12 may be non-volatile memory cells such as flash memory cells, or resistive random access memory (RRAM) cells. Embodiments of the inventive concept will be mainly described with reference to SRAM cells, but are not limited thereto.

Referring to FIG. 1, I/O blocks 13 may be disposed adjacent to the memory cell blocks 11 in the second direction Y. The I/O blocks 13 may perform a write or read operation. The row driver 14 may be disposed adjacent to the memory cell block 11 in the first direction X. The row driver 14 may be disposed between a plurality of memory cell blocks 11. The row driver 14 may access the bitcells 12 through the word lines. The control block 15 is disposed adjacent to the I/O blocks 13 in the first direction X, and to the row driver 14 in the second direction Y. The control block 15 may be disposed between the I/O blocks 13. The control block 15 may transmit signals for performing the write or read operation. The memory cell blocks 11, the I/O blocks 13, the row driver 14, and the control block 15 will be described later with reference to FIG. 2.

Figure 2:
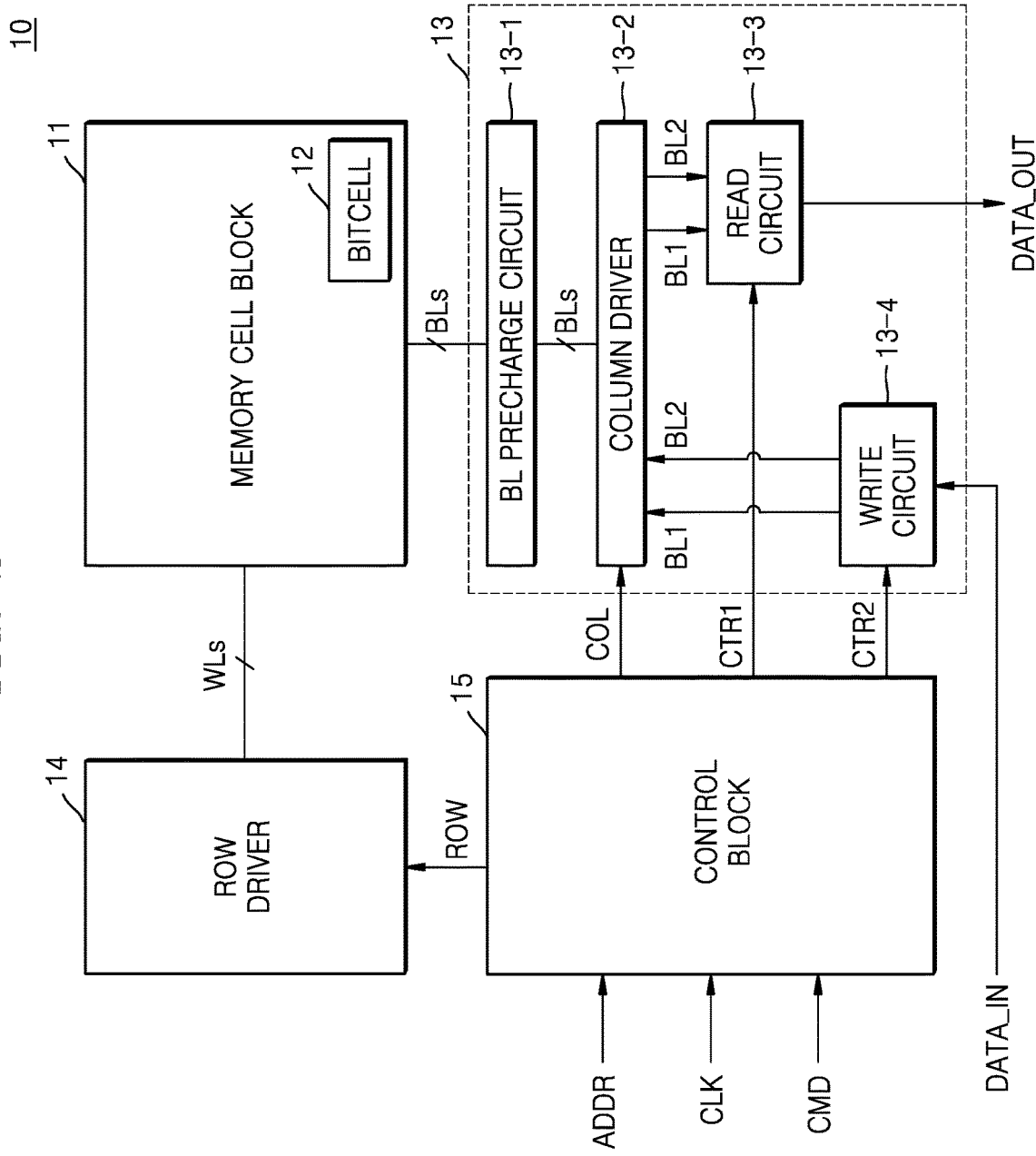
FIG. 2 is a block diagram showing an integrated circuit, according to an embodiment.

FIG. 2 is a block diagram showing an integrated circuit according to an embodiment. In detail, the block diagram of FIG. 2 is for the sake of understanding the layout diagram of FIG. 1, and indicates the memory device 10 included in the integrated circuit.

Referring to FIG. 2, the memory device 10 may receive a command CMD, an address ADDR, a clock signal CLK, write data DATA_IN, and read data DATA_OUT. For example, the memory device 10 may receive the command CMD (may be referred to as a write command) for instructing a write operation, the address (may be referred to as a write address), and the write data DATA_IN, and store the write data DATA_IN in a region of the memory cell block 11, which corresponds to the address. In addition, the memory device 10 may receive the command CMD (may be referred to as a read command) for instructing a read operation and the address (may be referred to as a read address), and externally output the read data DATA_OUT stored in a region of the memory cell 11, which corresponds to the address.

The memory cell block 11 may include a plurality of bitcells 12. Each of the bitcells 12 may be connected to one of a plurality of word lines WLs, and to at least one of a plurality of bitlines BLs.

The row driver 14 may be connected to the memory cell block 11 through a plurality of word lines WLs. The row driver 14 may activate one word line among the word lines WLs on the basis of a row address ROW. Accordingly, memory cells connected to the activated word lines may be selected from among the memory cells. In other words, the row driver 14 may select any one of the word lines WLs.

The control block 15 may receive the command CMD, the address ADDR, and the clock signal CLK, and generate a row address ROW, a column address COL, a read signal CTR1, and a write signal CTR2. For example, the control block 15 may identify a read command by decoding the command CMD, and generate the row address ROW, the column address COL and the read signal CTR1 for reading the read data DATA_OUT. In addition, the control block 15 may identify a write command by decoding the command CMD, and generate the row address ROW, the column address COL, and the write signal CTR2 for writing the write data DATA_IN.

The I/O block 13 may include a bitline precharge circuit 13-1, a column driver 13-2, a read circuit 13-3, and a write circuit 13-4.

The bitline precharge circuit 13-1 may be connected to the memory cell block 11 through a plurality of bitlines BLs. The bitline precharge circuit 13-1 may precharge the bitlines BLs. The bitlines BLs may include bitlines connected to both ends of the memory cell and a bitline bar complementary to the bitline.

The column driver 13-2 may be connected to the bitlines BLs through the bitline precharge circuit 13-1. The column driver 13-2 may select at least one bitline from among the bitlines BLs on the basis of the column address COL. According to the selection of at least one bitline from among the bitlines BLs, bitcells 12 may be selected which are connected to the selected bitlines from among the bitcells 12. At least one bitline may include a first bitline BL1 and a second bitline BL2 complementary to the first bitline BL1. The first bitline BL1 and the second bitline BL2 may be connected to both ends of the bitcells 12 of the memory cell block 11. The connection relationship between the bitcells 12, and the first and second bitlines BL1 and BL2 will be described later with reference to FIG. 10.

At the time of the read operation, the read circuit 13-2 may sense a current and/or voltage received through the bitlines BLs to identify values stored in the bitcells 12 selected, namely, connected to the activated word lines, and output the read data DATA_OUT on the basis of the identified values. The read circuit 13-3 may be connected to the column driver 13-2 through at least one bitline among the bitlines BLs. The at least one bitline may include the first bitline BL1 and the second bitline BL2. The read circuit 13-3 may receive the read signal CTR1 from the control block 15. The read circuit 13-3 may include a sense amplifier.

At the time of the write operation, the write circuit 13-4 may apply a current and/or a voltage to the bitlines BLs on the basis of the write data DATA_IN, and write values to the bitcells 12 connected to the activated word lines, namely, the selected word lines. The write circuit 13-4 may be connected to the column driver 13-2 through at least one bitline among the bitlines BLs. The at least one bitline may include the first bitline BL1 and the second bitline BL2. The write circuit 13-4 may receive the write signal CTR2 from the control block 15.

Figure 3:
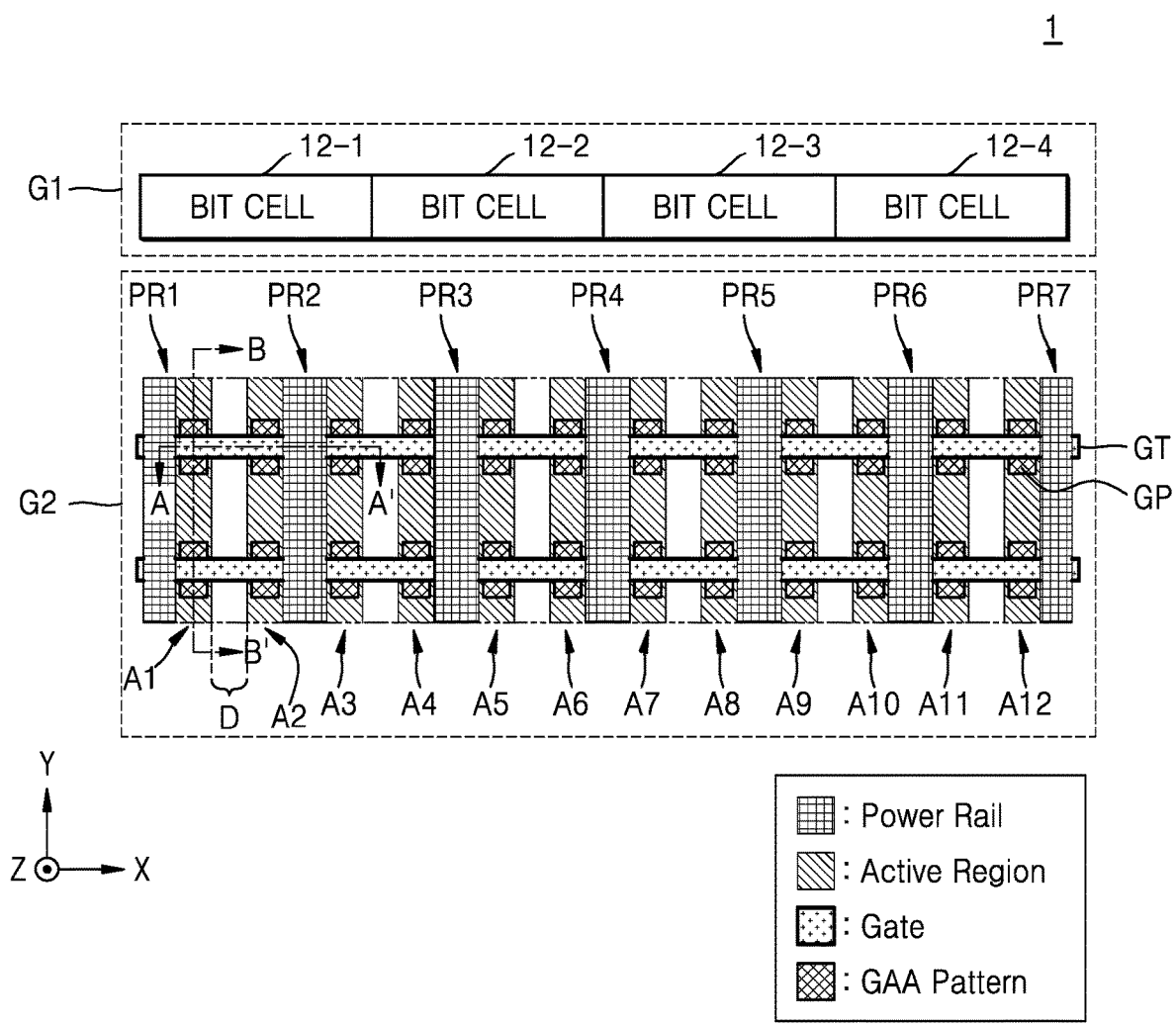
FIG. 3 is a layout diagram of an integrated circuit, according to an embodiment.

FIG. 3 is a layout diagram of an integrated circuit according to an embodiment. In detail, FIG. 3 illustrates a layout for explaining a bitcell group G1 and an I/O group G2 corresponding to the bitcell group G1 on an X-Y plane. The bitcell groups G1 and the I/O groups G2 may be repetitively arranged a plurality of number of times in the first direction X, and only one bitcell group G1 and one I/O group G2 are illustrated for explanation.

Referring to FIG. 3, the bitcell group G1 may include a plurality of bitcells 12-1 to 12-4. The bitcell group G1 may include the first number of bitcells. For example, the first number may be four. In the present embodiment, the four bitcells 12-1 to 12-4 are illustrated, but are not limited thereto. A first bitcell 12-1, a second bitcell 12-2, a third bitcell 12-3, and a fourth bitcell 12-4 may be arranged to be adjacent to each other in the first direction. The bitcell group G1 may be included in the memory cell block 11. The memory cell block 11 of FIG. 1 may include a plurality of bitcell groups G1. The bitcell groups G1 may be repetitively arranged in the first direction.

The I/O group G2 may include a plurality of active regions A1 to A12, a plurality of power rails PR1 to PR7, a plurality of gate electrodes GT, and a plurality of GAA patterns GP.

In detail, the I/O group G2 may include the active regions A1 to A12. The active regions A1 to A12 may be separated from one another in the first direction X. Each of the active regions A1 to A12 may extend in the second direction Y. Each of the active regions A1 to A12 may continuously extend in the second direction Y within the I/O group G2. The active regions A1 to A12 may form one active region group. The integrated circuit 1 may include a plurality of transistors, and the transistors may be formed in the active regions A1 to A12. Each of the active regions A1 to A12 may be an N-type active region in which an N-type transistor is formed or a P-type active region in which a P-type transistor is formed.

In the present specification, the transistors may be described later as gate-all-around FETs (GAAFETs), but have arbitrary structures. For example, the transistors may include fin FETs (FinFETs) formed from active patterns extending in a fin type and gate electrodes. The transistors may also include multi-bridge channel FETs (MBCFETs) formed from a plurality of nanosheets extending in parallel to each other and gate electrodes. The transistors may also include ForkFETs having a structure in which nanosheets for P-type transistors are separated from nanosheets for N-type transistors through dielectric walls, and thus, the N-type transistors and the P-type transistors are closer to each other. The transistors may also include vertical FETs (VFETs) having source/drain regions mutually separated in the Z axis-direction of FIG. 2, and gate electrodes surrounding channel regions. The transistors may also include not only FETs such as complementary FETs (CFETs), negative FETs (NCFETs), or carbon nanotube FETs (CNTs), but also bipolar junction transistors, or three-dimensional transistors.

A plurality of gate electrodes GT may be disposed separately from each other in the second direction Y, and extend in the first direction X. Accordingly, the gate electrodes GT may partially overlap the active regions A1 to A12. The gate electrodes GT may have a structure corresponding to a gate stage of the transistors included in the integrated circuit 1. The gate electrodes GT may be below the power rails PR1 to PR7.

The power rails PR1 to PR7 may be disposed separately from one another in the first direction X, and may each extend in the second direction Y. The power rails PR1 to PR7 may be formed on a same wiring layer. Each of the power rails PR1 to PR7 may be disposed adjacent to first sides of the active regions A1 to A12. The active regions A1 to A12 may be disposed between the power rails PR1 to PR7. Every two of the active regions A1 to A12 may be disposed between the power rails PR1 to PR7. The power rails PR1 to PR7 may form one power rail group. The embodiment is not limited to FIG. 1, and, unlike FIG. 1, every two or more of the active regions A1 to A12 may be disposed between the power rails PR1 to PR7. The power rails PR1 to PR7 may apply voltages to transistors formed in the active regions A1 to A12.

GAA patterns GP may be positioned on the active regions A1 to A12. The GAA patterns GP may partially overlap the gate electrodes GT. The GAA patterns GP may be formed at positions at which the active regions A1 to A12 cross the gate electrodes GT. The GAA patterns GP may be mutually separated in the first direction X to extend in the second direction Y. The GAA patterns GP may discontinuously extend in the second direction Y. The GAA patterns GP may include a plurality of nanosheets. In this case, the transistors may include GAAFETs formed from the nanosheets and the gate electrodes. The GAAFETs may include MBCFETs. The MBCFETs may include MOS transistors. The transistors may also include ForkFETs, each having a structure in which nanosheets for a P-type transistor are separated from nanosheets for an N-type transistor through a dielectric wall and thus the N-type transistor and the P-type transistor are closer to each other. A planar shape of each of the GAA patterns GP is illustrated as a quadrangle, but is not limited thereto.

Although not shown in the drawing, signal lines may be disposed between the power rails PR1 to PR7. The signal lines included in one I/O group G2 may configure one signal line group. The signal lines will be described with reference to FIG. 6.

The I/O group G2 may correspond to the bitcell group G1. The bitcells 12-1 to 12-4 may include a first number of bitcells, and the active regions A1 to A12 may include a second number of active regions. The first number and the second number may be respectively integers equal to or greater than 1. The second number may be greater than twice the first number. For example, the second number may be three times the first number. For example, the first number is two, and the second number is six. For example, the first number is four, and the second number is 12, as shown in FIG. 3. In another embodiment, the first number may be four, and the second number may be greater than 12. The first number of bitcells may be connected to the transistors formed in the second number of active regions. As the second number is formed to be greater than twice the first number, a transistor may be additionally disposed while the width of the gate electrode GT in the second direction Y is kept constant. Accordingly, The distance between the transistors may be reduced.

The I/O group G2 may be included in the I/O block 13 of FIG. 1. The I/O block 13 of FIG. 1 may include a plurality of I/O groups G2. The I/O groups G2 may be repetitively arranged in the first direction X. In other words, the I/O block 13 of FIG. 1 may include a first active region group including the second number of active regions and a second active area group including the second number of active regions, and the first active region group may be adjacent to the second active region group in the first direction X. The first active region group and the second active region group may correspond to different bitcell groups G1 disposed adjacent to each other in the first direction X. In addition, the I/O block 13 of FIG. 1 may include a first power rail group and a first signal line group formed on the first active region group, and a second power rail group and a second signal line group formed on the second active region group. The layout of the first active region group may be the same as that of the second active region group, the layout of the first power rail group may be the same as that of the second power rail group, and the layout of the first signal line group may be the same as that of the second signal line group.

In the present embodiment, as the bitcell group G1 including four bitcells 12-1 to 12-4 correspond to the I/O group G2 including 12 active regions A1 to A12, the first active region A1 to the third active region A3 may correspond to the first bitcell 12-1. Because a transistor may be formed in a section in which the active regions A1 to A12 cross the gate electrodes GT, at least three transistors may be connected to one bitcell.

In the present embodiment, as the number of transistors to be connectable to one bitcell increases, a semiconductor device and an integrated circuit including the semiconductor device having a higher device density may be provided. As the device density enhances, parasitic capacitance and resistance of the transistors included in the semiconductor device may be reduced. As the device density of the semiconductor device is improved, the price competitiveness improves.

In addition, because an interval D between the active regions A1 to A12 is formed constant, the pattern of the active regions A1 to A12 may be simplified. Accordingly, possible defects occurring in a manufacturing process may be prevented or reduced.

Figure 4:
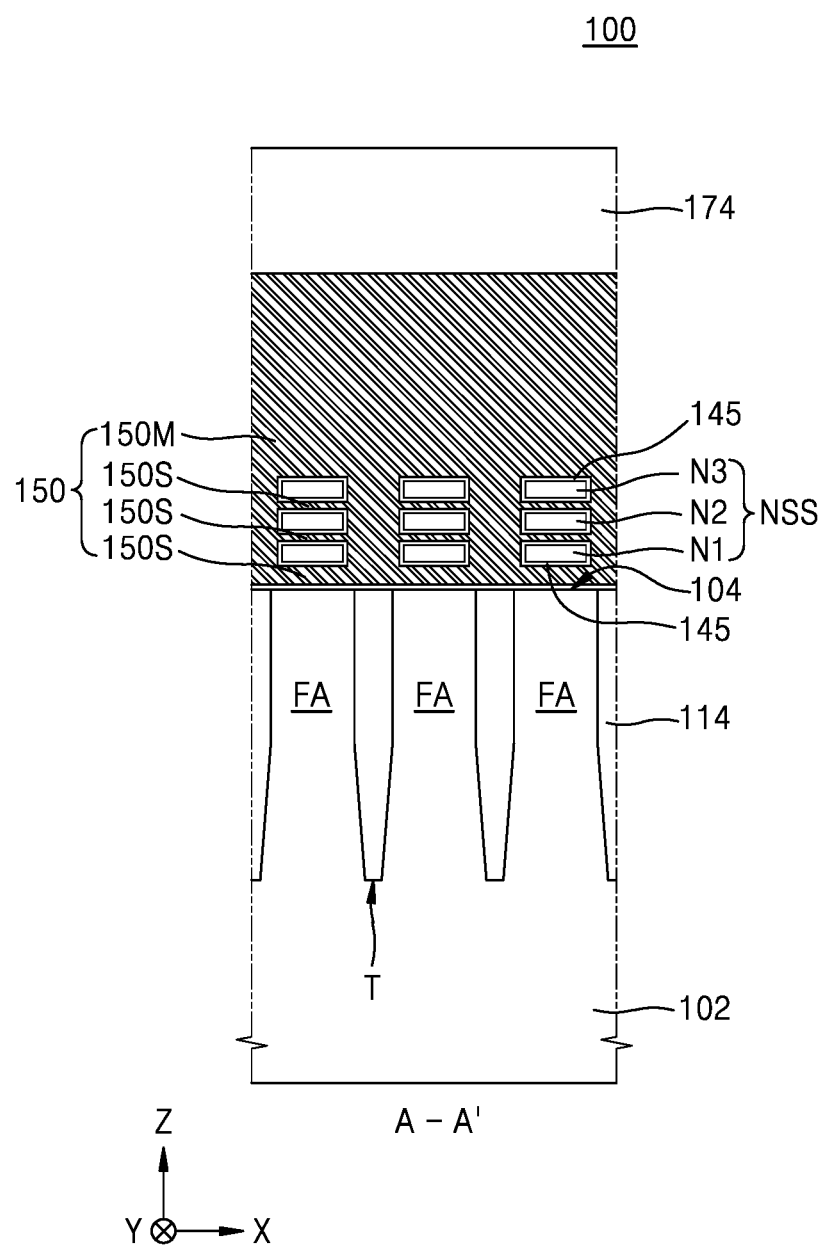
FIG. 4 is a cross-sectional view according to line A-A' of FIG. 3, according to an embodiment.
Figure 5:
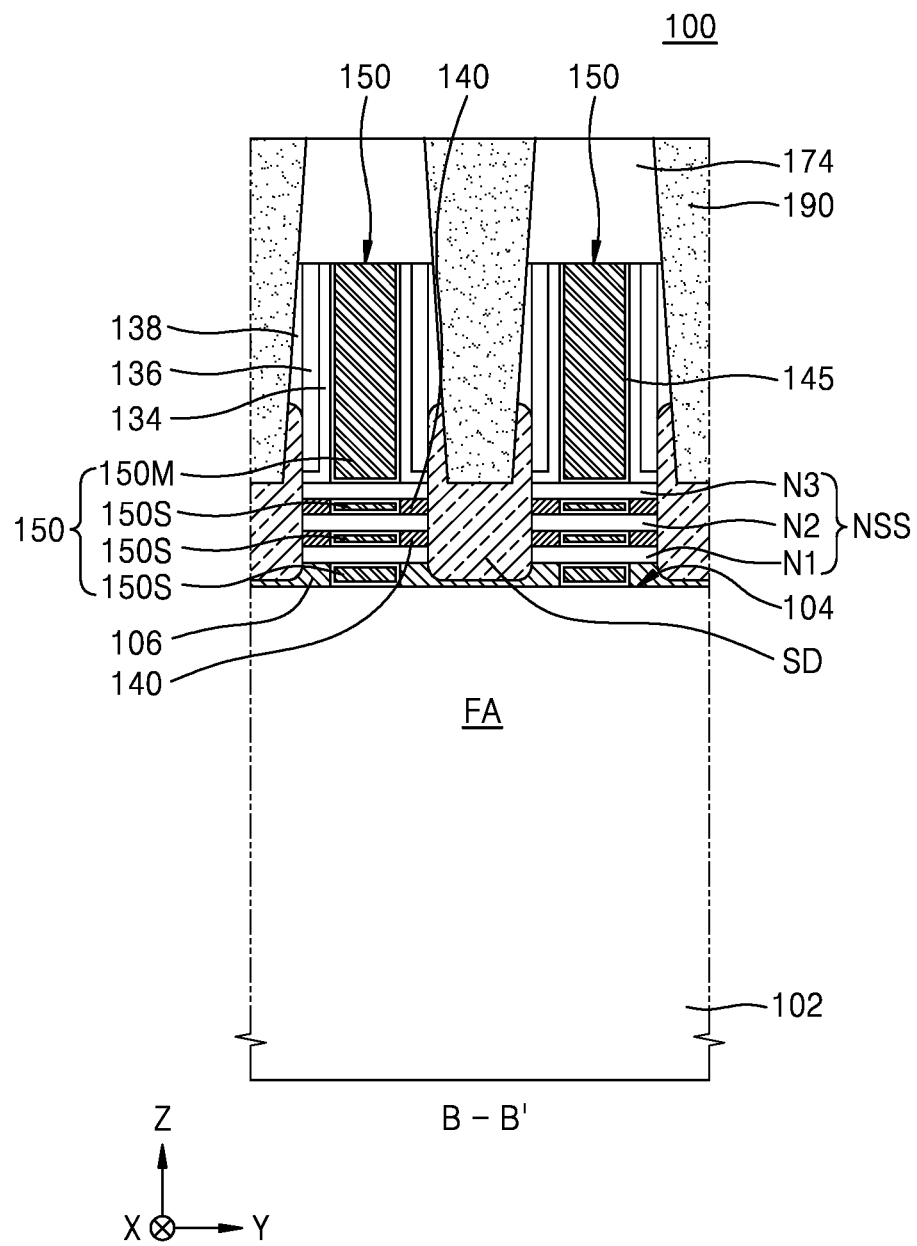
FIG. 5 is a cross-sectional view according to line B-B' of FIG. 3, according to an embodiment.

FIG. 4 is a cross-sectional view according to line A-A' of FIG. 3, and FIG. 5 is a cross-sectional view according to line B-B' of FIG. 3. In detail, the integrated circuit 1 of FIG. 3 may include a GAA transistor, and FIGS. 4 and 5 are cross-sectional views for explaining multi-bridge channel (MBC) transistor 100 formed in the active regions A1 to A12 of FIG. 3. Accordingly, the power rails PR1 to PR7 of FIG. 3 are omitted.

Referring to FIG. 4, the MBC transistor 100 may include a plurality of fin-type active regions FA protruding from a substrate 102 and extending in the second direction Y, and a plurality of nanosheet stack structures NSS facing a top surface 104 of the fin-active regions FA at a position separated from the top surface 104 of the fin-active regions FA. The fin-active regions FA may represent a plurality of active regions A1 to A12 of FIG. 3.

Trenches T restricting the fin-active regions FA may be formed in the substrate 102. The substrate 102 may include a conductive region, for example, a well or structure doped with impurity. The trench T may be filled with a shallow trench isolation (STI) film 114. The STI film 114 may include an insulation material. A level of the top surface 104 of the fin-active regions FA may be the same as or similar to a level of a top surface of the STI film 114.

The nanosheet stack structures NSS may be separated from the top surface 104 of the fin-active regions FA. The nanosheet stack structures NSS may include nanosheets N1, N2, and N3 extending in parallel with the top surface of the fin-active regions FA. The nanosheets N1, N2, and N3 may be sequentially stacked on the top surface 104 of the fin-active regions FA one by one, and may each have a channel region. In the present embodiment, a configuration, in which the nanosheets N1, N2, and N3 and a gate structure 150 is formed on one fin-active region FA, and the three nanosheets N1, N2, and N3 are stacked in each of the nanosheet stack structures, is illustrated, but is not limited thereto. A case in which a planar shape of the nanosheet stack structure NSS has approximately a rectangular shape is illustrated, but is not limited thereto. The nanosheet stack structure NSS may have various planar shapes according to the planar shapes of the fin-type active region FA and the gate structure 150. The nanosheets N1, N2, and N3 may be formed from a same material as the substrate 102.

The gate structure 150 may extend in the second direction Y, which crosses with the first direction X, on the fin-type active regions FA. The gate structure 150 may be formed to cover the nanosheet stack structure NSS and surround at least a portion of the nanosheets N1, N2, and N3. The gate structure 150 may include a main gate portion 150M configured to cover a top surface of the nanosheet stack structure NSS, and a plurality of sub-gate portions 150S formed between the fin-type active region FA and the nanosheets N1, N2, and N3. The main gate portion 150M and the sub-gate portions 150S may be connected to each other. The thickness of each of the sub-gate portions 150S may be less than that of the main-gate portion 150M.

A gate dielectric film 145 may be formed between the nanosheet stack structure NSS and the gate structure 150. An inter-layer insulation film 174 may be formed on the gate structure 150.

Referring to FIG. 5, a source/drain region SD may be formed on an upper portion of the fin-type active region FA. The source/drain region SD may be connected to one-side ends of the neighboring nanosheets N1, N2, and N3. Insulation liners 134 disposed on side walls of the gate 150 on the nanosheet stack structure NSS, first insulation spacers 136 on the insulation liners 134, and protection films 138 on the first insulation spacers 136 may be formed. The insulation liners 134, the first insulation spacers 136, and the protection films 138 may be disposed on the side walls of the main gate portion 150M. In another embodiment, the protection films 138 may be omitted.

Second insulation spacers 140 disposed on at least some side walls of the sub-gate portions 150S may be formed. The second insulation spacers 140 may be disposed between the nanosheets N1, N2, and N3. The second insulation spacers 140 may be disposed between the sub-gate portions 150S and the source/drain region SD.

A buffer semiconductor layer 106 may be disposed on both side walls of the sub-gate portion 150S, which are closest to the fin-type active region FA. The buffer semiconductor layer 106 may also be disposed on the top surface 104 of the fin-type active region FA. The buffer semiconductor layer 106 may be formed from a different material from the fin-type active region FA.

A contact plug 190 may be connected to the source/drain region SD. The contact plug 190 may penetrate through the inter-layer insulation film 174 and the protection layer 138 to be connected to the source/drain region SD.

Figure 6:
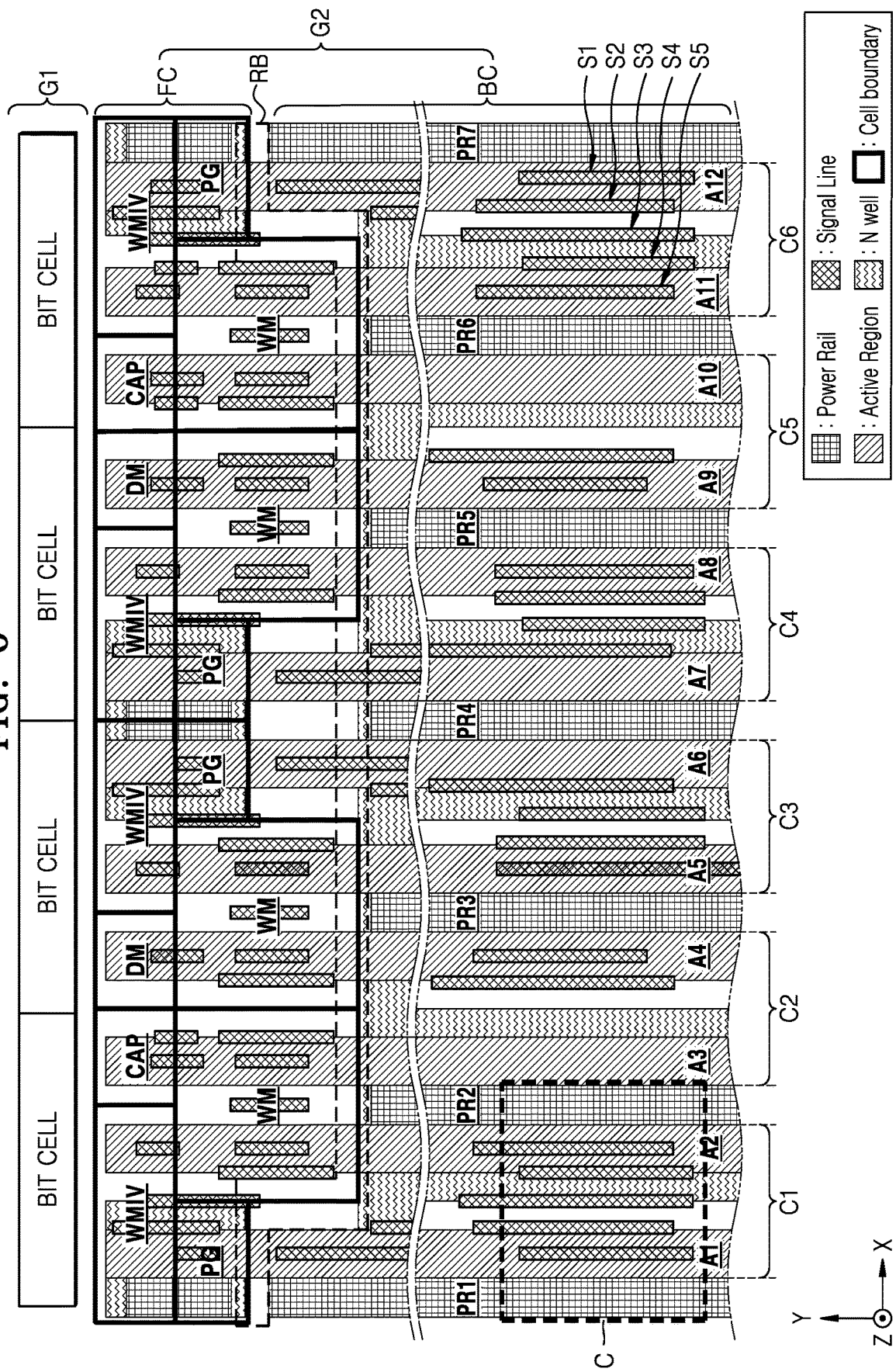
FIG. 6 is a layout diagram for explaining a bitcell group and an input and output (I/O) group, according to an embodiment.

FIG. 6 is a layout diagram for explaining a bitcell group and an I/O group, according to an embodiment. The bitcell group and the I/O group shown in FIG. 6 may be the same as the bitcell group G1 and the I/O group G2 shown in FIG. 3. Thus, the same reference numerals as those of FIGS. 1 to 3 indicate the same components, and repeated descriptions thereof are omitted.

Referring to FIG. 6, the bitcell group G1 may refer to a group of the first number of bitcells. In the present embodiment, the first number may be four. The first number of bitcells may be arranged in the first direction X. The bitcell group G1 may be included in the memory cell block 11 of FIG. 1. In the present embodiment, the bitcell group G1 is illustrated to include four bitcells, but is not limited thereto.

The I/O group G2 may correspond to the bitcell group G1. In other words, one I/O group G2 may correspond to each one of bitcell groups G1. In other words, one I/O group G2 may correspond to each one of bitcell groups G1. The bitcell group G1 and the I/O group G2 may be repetitively arranged in the first direction X.

The I/O group G2 may be divided into a front-end cell region FC and a back-end cell region BC. The front-end cell region FC may adjacent to the bitcell group G1 in the second direction Y. The back-end cell region BC may adjacent to the front-end cell region FC in the second direction Y.

The I/O group G2 may include a plurality of active regions A1 to A12 that are separated from each other in the first direction X, and extend in the second direction Y. Each of the active regions A1 to A12 may continuously extend in the second direction Y. In other words, each of the active regions A1 to A12 may be continuous over the boundary RB of the front-end cell region FC and the back-end cell region BC. The active regions A1 to A12 may include the second number of active regions. The second number may be an integer greater than double the first number. In the present embodiment, the second number may be 12. Accordingly, the active regions A1 to A12 may include 12 active regions. However, the embodiment is not limited hereto, and the second number may be an integer equal to or greater than 12.

Power rails PR1 to PR7 may be disposed with the active regions A1 to A12 therebetween. Every two of the active regions A1 to A12 may be between the power rails PR1 to PR7. For example, the first active region A1 and the second active region A2 may be disposed separately from each other in the first direction between the first power rail PR1 and the second power rail PR2. The power rails PR1 to PR7 may apply voltages to transistors formed in the active regions A1 to A12. At least one of the power rails PR1 to PR7 may be formed to be discontinued at the boundary RB between the front-end cell region FC and the back-end cell region BC. In the present embodiment, all the power rails PR1 to PR7 may be formed to be discontinued at the boundary RB between the front-end cell region FC and the back-end cell region BC. When the boundary RB between the front-end cell region FC and the back-end cell region BC may be referred to as a first boundary, and the boundary of the back-end cell region BC positioned opposite to the first boundary is referred to as a second boundary, at least one of the power rails PR1 to PR7 may be continuously formed from the first boundary to the second boundary. In other words, at least one of the power rails PR1 to PR7 may continuously extend in the second direction Y within the back-end cell region BC. In the present embodiment, the power rails PR1 to PR7 may not be discontinued within the back-end cell region BC.

Signal lines S1 to S5 may be disposed between the power rails PR1 to PR7. The signal lines S1 to S5 may apply signals to transistors formed in the active regions A1 to A12. Every five of the signal lines S1 to S5 may be disposed between the power rails PR1 to PR7. For example, the signal lines S1 to S5 may be disposed separately from one another in the first direction X between the sixth power rail PR6 and the seventh power rail PR7. The signal lines S1 to S5 may be formed to have different lengths. The signal lines S1 to S5 may be differently disposed as necessary. The signal lines S1 to S5 may form one signal line group.

The front-end cell region FC and the back-end cell region BC may include various logic cells. The logic cells may include transistors formed in the active regions A1 to A12. The logic cells may have a bilaterally symmetric layout. The logic cells may include switches, inverters, etc. The logic cells may be respectively disposed in a plurality of columns C1 to C6. The logic cells may occupy different areas within the I/O groups G2. The number and the type of the logic cells included in the I/O groups G2 are not limited to the present embodiment. The logic cells may receive power from the power rails PR1 to PR7, and input signals or output signals through the signal lines S1 to S5. In another embodiment, the logic cells may include standard cells. The standard cells may have a structure complying with a predefined specification.

In the present embodiment, the front-end cell region FC may include logic cells adjacent to the bitcell group G1 in the second direction Y. Because the bitcell group G1 may be included in the memory cell region 11 of FIG. 1, the front-end cell region FC may include logic cells adjacent to the memory cell region 11 in the second direction Y. Each of the logic cells in the front-end cell region FC may include a switch adjustment unit WMIV, a write switch WM, a power gating cell PG, a cap measurement transistor CAP, and a dummy DM.

The logic cells in the front-end cell region FC may have a bilaterally symmetric layout. For example, a plurality of the switch adjustment units WMIV disposed in the front-end cell region FC may be disposed at a bilaterally symmetric position. The logic cells in the front-end cell region FC may include a bilaterally symmetric layout to stably perform operations. That is, since the logic cells of the front-end cell region FC are symmetrical, the operation may be stably performed. For example, since the switch adjustment units WMIV may have a bilaterally symmetric layout, the time at which signals are transmitted to the switch adjustment units WMIV may be the same. Accordingly, the accuracy of the signal can be increased. The present embodiment discloses that each of the logic cells of the front-end cell region FC includes the switch adjustment unit WMIV, the write switch WM, the power gating cell PG, the cap measurement transistor CAP, and the dummy DM, but is not limited thereto, and other logic cells may be disposed in the front-end cell region FC.

The switch adjustment unit WMIV may be disposed adjacent to the bitcell group G1 in the second direction Y. The switch adjustment unit WMIV may include two active regions. For example, the switch adjustment unit WMIV may include the first active region A1 and the second active region A2. Four switch adjustment units WMIV may be disposed in one I/O group G2.

The write switch WM may be disposed adjacent to the switch adjustment unit WMIV in the second direction Y. The write switch WM may include two active regions. For example, the write switch WM may include the second active region A2 and the third active region A3. Four write switches WM may be disposed in one I/O group G2. The write switch WM may be electrically connected to the switch adjustment unit WMIV. The write switch WM may not include any one of the power rails PR1 to PR7. The switch adjustment unit WMIV, rather than the write switch WM, is disposed closer to the bitcell group G1, a distance between the write switch WM and the switch adjustment unit WMIV is made short, and thus, errors in signals may be reduced. Accordingly, a write operation may be stably performed.

The power gating cell PG may be disposed adjacent to the switch adjustment unit WMIV in the second direction Y, and to the write switch WM in the first direction X. The power gating cell PG may include one active region. For example, the power gating cell PG may include the first active region A1. Four power gating cells PG may be disposed in one I/O group G2. The power gating cell PG may not be electrically connected to the write switch WM and the switch adjustment unit WMIV.

The cap measurement transistor CAP and the dummy DM may be disposed adjacent to the switch adjustment unit WMIV in the first direction X, and to the write switch WM in the second direction Y. The cap measurement transistor CAP may measure capacitances of the transistors formed in the active regions A1 to A12. The dummy DM may not include a transistor, and be disposed to stably perform an I/O operation.

The back-end cell region BC may include logic cells adjacent to the logic cells in the front-end cell region FC in the second direction Y. The back-end cell region BC may include a plurality of various logic cells. For example, the logic cells may include switches, inverters, etc. The logic cells or combinations of the logic cells disposed in the back-end cell region BC may configure a sense amplifier, a write driver, or a level shifter. The logic cells in the back-end cell region BC may have a bilaterally symmetric layout.

A region C of FIG. 6 is for explaining vias disposed in the I/O group G2, and will be described later with reference to FIG. 9.

Figure 7:
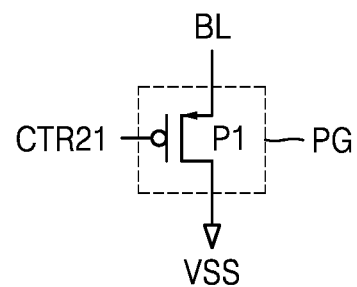
FIGS. 7 and 8 are circuit diagrams showing logic cells of FIG. 6, according to an embodiment.

FIG. 7 is a circuit diagram representing a power gating cell among logic cells shown in FIG. 6, according to an embodiment.

Referring to FIG. 7, the power gating cell PG may include one transistor. As described above, the transistor may be a GAAFET. The transistor may be an MBCFET. The power gating cell PG may include one P-type field-effect transistor (PFET). The power gating cell PG may provide power to a bitline BL according to a first write signal CTR21.

Figure 8:
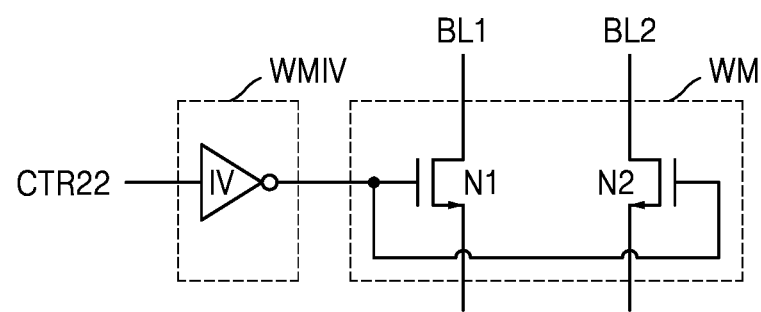

FIG. 8 is a circuit diagram representing a switch adjustment unit WMIV and a write switch WM among logic cells shown in FIG. 6, according to an embodiment.

Referring to FIG. 8, the switch adjustment unit WMIV and the write switch WM may be electrically connected to each other. The switch adjustment unit WMIV may include one inverter IV. Accordingly, the switch adjustment WMIV may invert a second write signal CTR22. The write switch WM may be controlled by the switch adjustment unit WMIV.

The write switch WM may include two transistors. As described above, the transistors may be GAAFETs. The transistors may be MBCFETs. The write switch WM may include two N-type field-effect transistors (NFETs). The two NFETs may receive the same signal. The write switch WM may receive the second write signal CTR22 inverted by the switch adjustment unit WMIV. The write switch WM may transmit write data to a first bit line BL1 and a second bit line BL2 according to the inverted write signal CTR22. The second bit line BL2 may be complementary to the first bit line BL1. The first bitline BL1 and the second bitline BL2 may be connected to at least one of bitcells included in the bitcell group G1 of FIG. 6.

Figure 9:
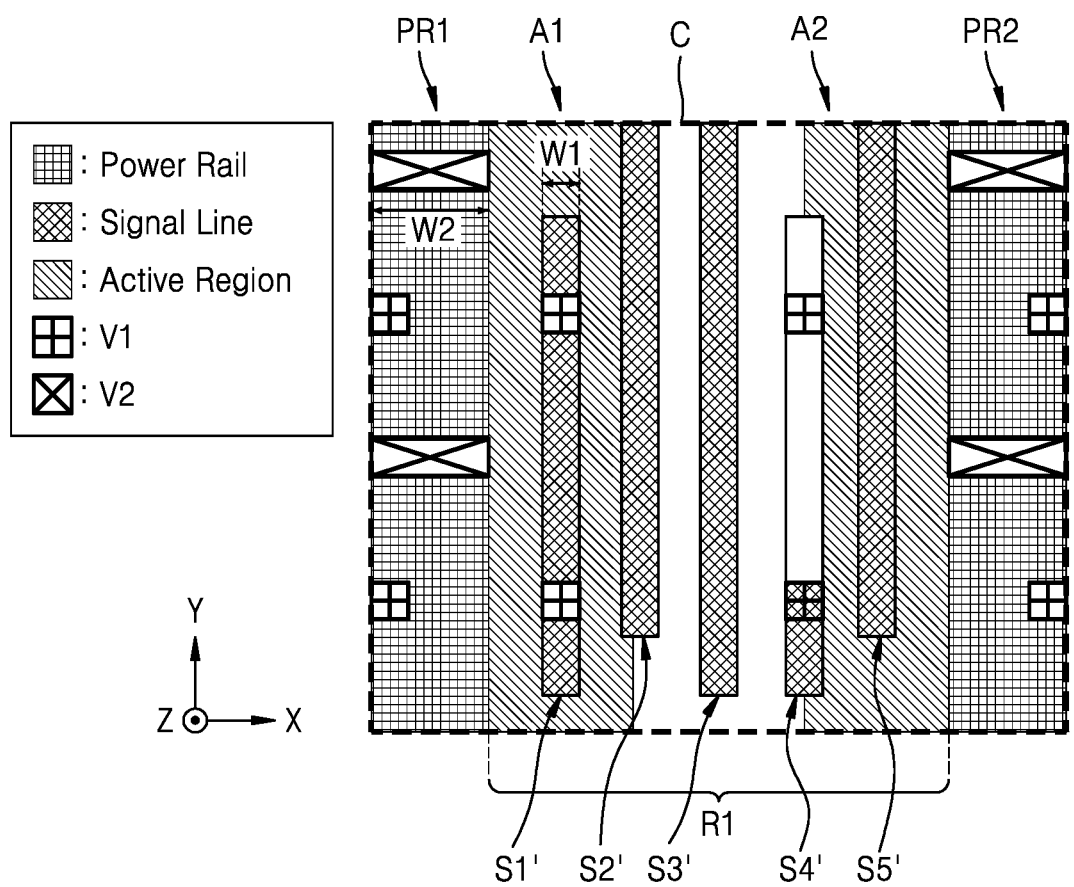
FIG. 9 is a layout diagram of an enlarged region C of FIG. 6, according to an embodiment.

FIG. 9 is a layout diagram of an enlarged region C shown in FIG. 6, according to an embodiment. In detail, FIG. 9 is a layout diagram for explaining a plurality of vias included in the I/O group G2. The same reference numerals as those of FIG. 6 indicate the same components, and repeated descriptions thereof are omitted.

Referring to FIG. 9, first vias V1 may be positioned below signal lines S1' to S5'. The first vias V1 may be connected to one of the signal lines S1' to S5'. The signal lines S1' to S5' may be connected to at least one via V1. A width of the first via V1 may be formed to be equal to or smaller than a width W1 of the signal lines S1' to S5'.

The first vias V1 and second vias V2 may be below the first power rail PR1 and the second power rail PR2. The first power rail PR1 and the second power rail PR2 may be connected to at least one second via V2. The first power rail PR1 and the second power rail PR2 may be connected to at least one first via V1. A width of the second via V2 may be formed to be equal to or smaller than a width W2 of each of the first power rail PR1 and the second power rail PR2. A size of the second via V2 may be formed to be greater than that of the first via V1. Because the width W2 of each of the first power rail PR1 and the second power rail W2 is formed to be wider than the width W1 of the signal lines S1' to S5', the size of the second via V2 may be greater than that of the first via V1.

The first via V1 and the second via V2 may be disposed at a same level, and the signal lines S1' to S5', the first power rail PR1, and the second power rail PR2 may be disposed to be higher than the first via V1 and the second via V2. The first power rail PR1 and the second power rail PR2 include the first via V1, which has a smaller size than the second via V2, and thus, resistances of all the first and second vias V1 and V2 may be reduced. As the resistances of all the first and second vias V1 and V2 are reduced, the performance of the integrated circuit including the I/O group G2 may be enhanced.

Figure 10:
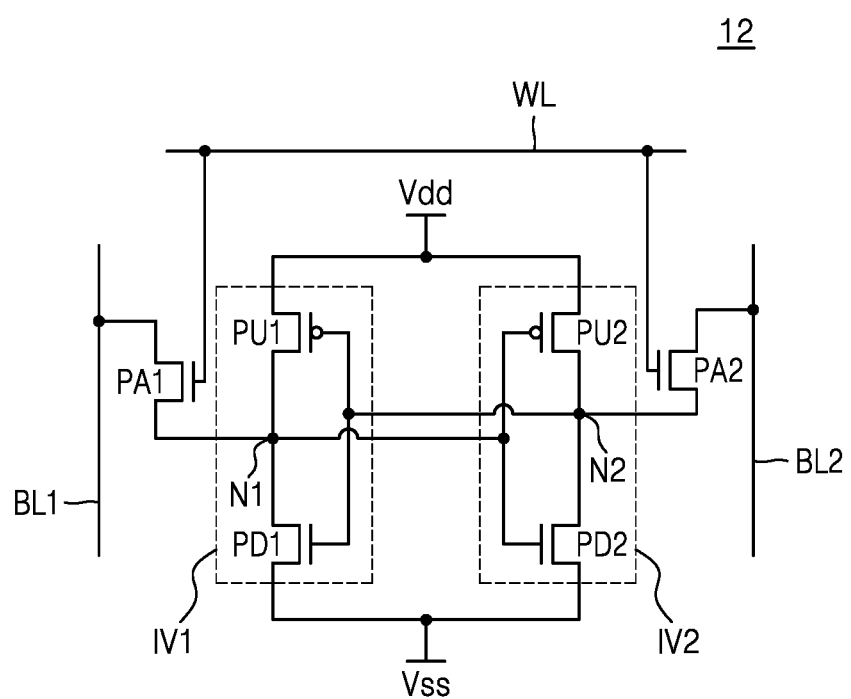
FIG. 10 illustrates a circuit diagram showing a bitcell, according to an embodiment.

FIG. 10 illustrates a circuit diagram for explaining a bitcell, according to an embodiment. In detail, the bitcell may be included in the memory cell block 11 of FIG. 1 or FIG. 2, or may be the bitcell 12 of FIG. 1 or FIG. 2. In the present embodiment, the bitcell 12 may be an SRAM bitcell. In another embodiment, the bitcell 12 may be a volatile memory cell such as a DRAM cell, or a non-volatile memory cell such as a flash memory cell or an RRAM cell.

Referring to FIG. 10, the bitcell 12 may include a first pull-up transistor PU1, a first pull-down transistor PD1, a second pull-up transistor PU2, a second pull-down transistor PD2, a first pass transistor PA1, and a second pass transistor PA2. The first pull-up transistor PU1 and the second pull-up transistor PU2 may be PFETs, and the first pull-down transistor PD1 and the second pull-down transistor PD2 may be NFETs.

The first pull-up transistor PU1 and the second pull-up transistor PU2 may configure a first inverter IV1. Gates of the first pull-down transistor PD1 and the second pull-down transistor PD2 may be connected to each other. Gates of the first pull-up transistor PU1 and the first pull-down transistor PD1 may correspond to an input terminal of the first inverter IV1. A first node N1 may correspond to an output terminal of the first inverter IV1.

The second pull-up transistor PU2 and the second pull-down transistor PD2 may configure a second inverter IV2. Gates of the second pull-up transistor PU2 and the second pull-down transistor PD2 may be connected to each other. The connected gates of the second pull-up transistor PU2 and the second pull-down transistor PD2 may correspond to an input terminal of the second inverter IV2. A second node N2 may correspond to an output terminal of the second inverter IV2.

The first inverter IV1 and the second inverter IV2 may be combined with each other to configure a latch structure. The gates of the first pull-up transistor PU1 and the first pull-down transistor PD1 may be electrically connected to the second node N2, and the gates of the second pull-up transistor PU2 and the second pull-down transistor PD2 may be electrically connected to the first node N1. In other words, the input terminal of the first inverter IV1 may be connected to the output terminal of the second inverter IN2, and the input terminal of the second inverter IV2 may be connected to the output terminal of the first inverter IN1.

A source/drain of the first pass transistor PA1 may be connected to the first node N1 and the first bit line BL1. A source/drain of the second pass transistor PA2 may be connected to the second node N2 and the second bit line BL2. The second bit line B2 may be complementary to the first bit line BL1. Gates of the first pass transistor PA1 and the second pass transistor PA2 may be electrically connected to a word line WL.

Figure 11:
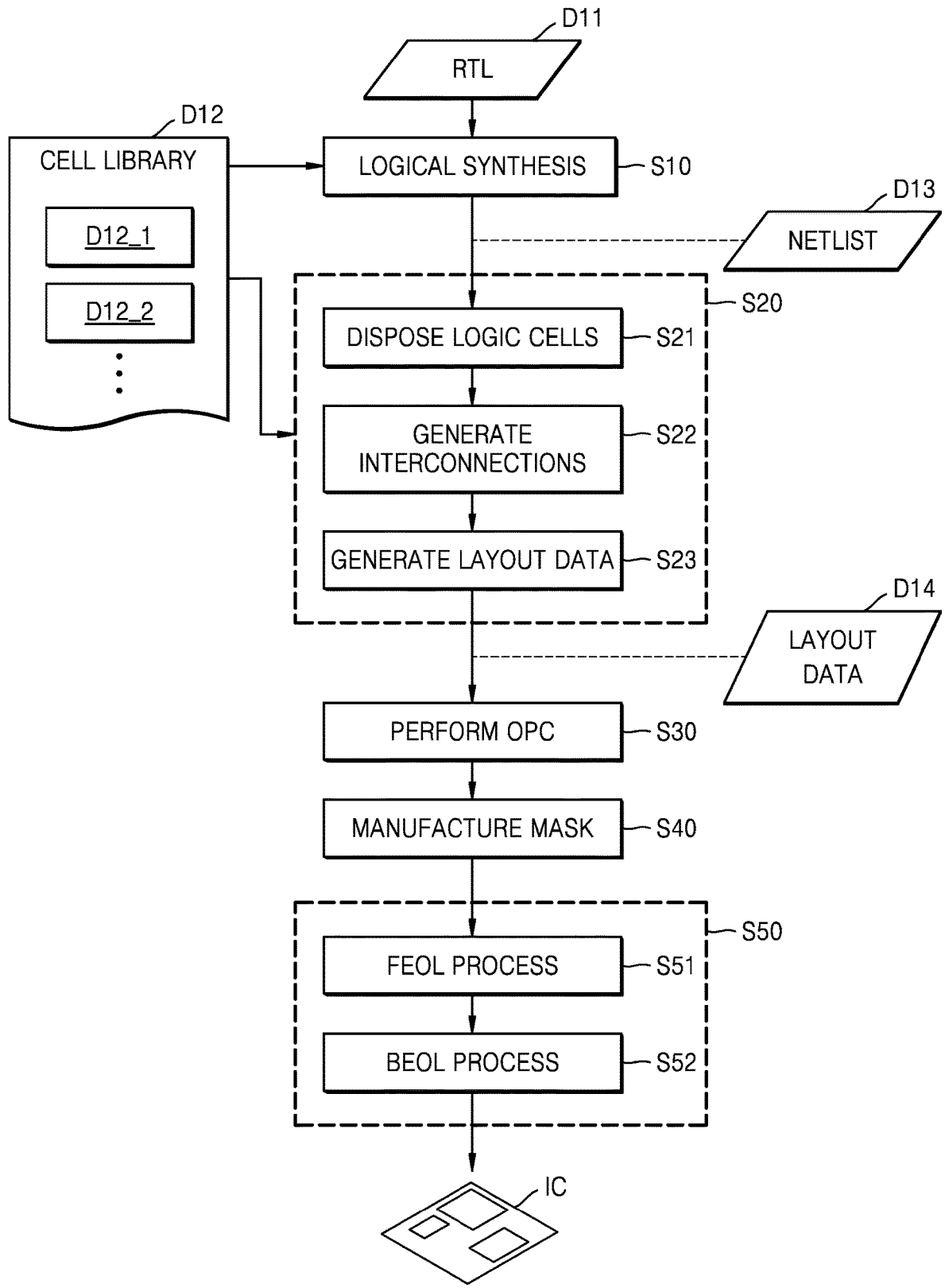
FIG. 11 is a flowchart showing a method of manufacturing an integrated circuit, according to an embodiment.

FIG. 11 is a flowchart showing a method of manufacturing an integrated circuit (IC), according to an embodiment.

Referring to FIG. 11, a cell library D12 may include information pertaining to the logic cells included in the I/O group G2 of FIG. 6. For example, function information, characteristic information, layout information, or the like about the logic cells may be included. In the present embodiment, the cell library D12 may include data D12-1, D12_2 or the like defining the layout of the logic cells. The logic cells may include standard cells. The standard cells may have a structure complying with a predefined specification.

In an operation S10, a logic synthesis operation may be performed for generating netlist data D13 from RTL data D11. For example, a semiconductor design tool may generate the netlist data D13 including a bitstream or a netlist by performing logic synthesis from the RTL data D11 that is created in a Hardware Description Language (HDL) with reference to the cell library D12. The HDL may include a VHSIC Hardware Description Language (VHDL), Verilog, etc. The cell library D12 may include information about the height of the logic cell, the number of pins included in the logic cell, the number of tracks corresponding to the logic cell, or the like. In the logic synthesis process, the logic cells may be included in the integrated circuit with reference to the cell library D12.

In an operation S20, a place & routing (P&R) operation may be performed in which layout data D14 is generated from the netlist data D13. The P&R operation S20 may include a plurality of operations S21, S22, and S23.

In an operation S21, an operation for disposing the logic cells may be performed. For example, the semiconductor design tool (for example, a P&R tool) may dispose a plurality of logic cells with reference to the cell library D12 from the netlist data D13. The logic cells may be disposed in the rows R1 to R6 as described with reference to FIG. 6. The logic cells may respectively occupy different areas within the I/O groups G2. Each of the logic cells may include the switch adjustment unit WMIV, the write switch WM, and the power gating cell PG disposed in the front-end cell region FC.

In an operation S21, an operation for disposing the power rails may be performed.

In an operation S22, an operation for generating interconnections may be performed. Through the interconnection operation, an output pin and an input pin of the logic cells may be electrically connected. The logic cells may include at least one via.

In an operation S23, an operation for generating the layout data D14 may be performed. The layout data D14 may include geometrical information about the cells and the interconnections. The layout data D14 may have the format such as GDSII.

In an operation S30, optical proximity correction (OPC) may be performed on the layout data D74 to determine a pattern on a mask. In other words, a distortion phenomenon such as refraction due to the characteristics of light may be corrected for the layout data D74 to form a pattern of a desired shape. In some embodiment, the layout of the integrated circuit may be restrictively modified in the operation S30. Through this, the structure of the integrated circuit may be optimized. The operation S30 may be referred to as design polishing.

In an operation S40, an operation for manufacturing a mask may be performed. In order to form the patterns determined in the operation S30, at least one mask may be manufactured. The mask may include a photomask.

In an operation S50, an operation for fabricating the integrated circuit may be performed. For example, a plurality of layers are patterned using at least one mask manufactured in the operation S40, and thus, the integrated circuit may be fabricated. As shown in FIG. 11, the operation S50 may include operations S51 and S52.

In an operation S51, a front-end-of-line (FEOL) process may be performed. The FEOL process may refer to an operation for forming individual elements on the substrate. The individual elements may include a transistor, a capacitor, a resistor, and the like. The FEOL process may include an operation for planarizing a wafer, an operation for cleaning the wafer, an operation for forming a trench, an operation for forming a well, an operation for forming a gate line, an operation for forming a source and a drain, and the like.

In an operation S52, a back-end-of-line (BEOL) process may be performed. The BEOL process may refer to an operation for interconnecting the individual elements. For example, the BEOL process may include an operation for siliciding gate, source, and drain regions, an operation for adding a dielectric, a planarization operation, an operation for forming a hole, an operation for adding a metal layer, an operation for forming a via, an operation for forming a passivation layer, and the like.

After the operation S52, the packaged IC may be used as a component for various applications.

Figure 12:
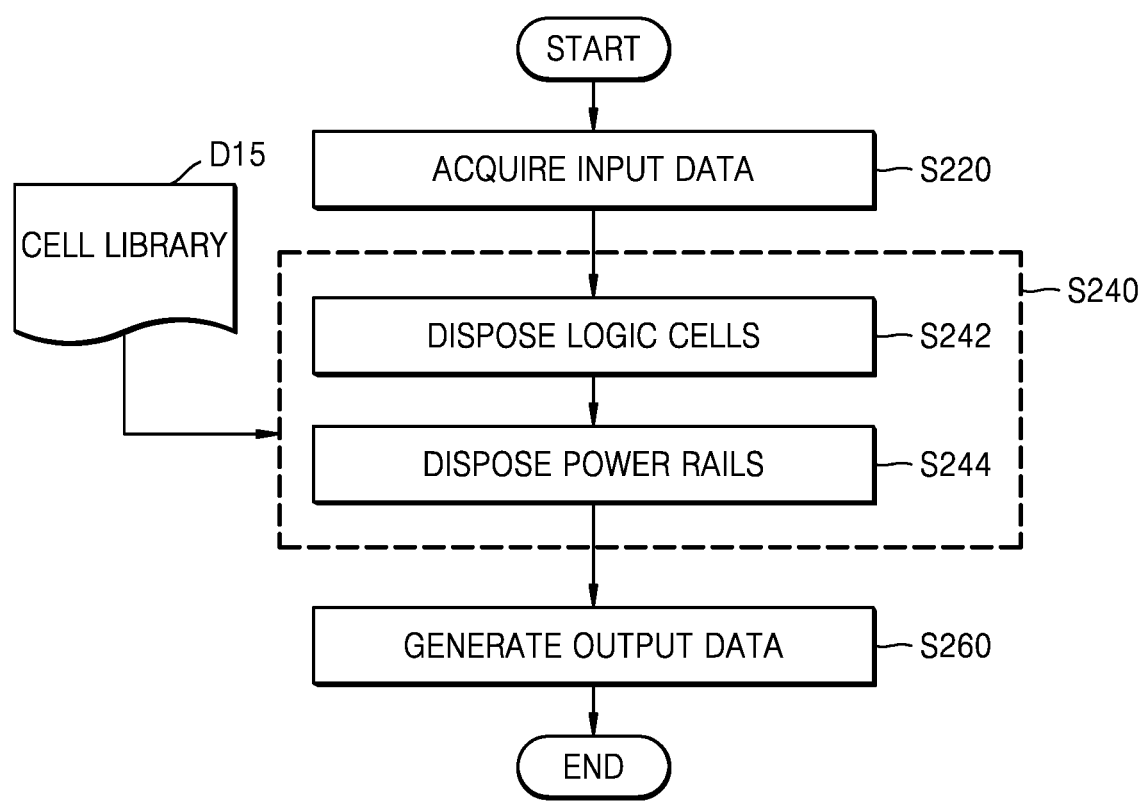
FIG. 12 is a flowchart showing an example of a method of designing an integrated circuit, according to an embodiment.

FIG. 12 is a flowchart showing an example of a method of designing an integrated circuit according to an embodiment. The method of FIG. 12 may be performed by a computing system including at least one processor that executes a series of instructions. As shown in FIG. 12, the method of designing an IC may include an operation S220, an operation S240, and an operation S260.

In the operation S220, an operation for acquiring input data may be performed. The input data may refer to data defining the integrated circuit, and include the netlist described above with reference to FIG. 11. The netlist may include information about logic cells and connections included in the integrated circuit.

In the operation S240, P&R may be performed on the basis of the cell library D15. The operation S240 may correspond to the operations S21 and S22 of FIG. 11. The operation 240 may include a plurality of operations S242 and S244.

In the operation S242, an operation for disposing the logic cells having signal lines arranged along tracks determined in advance may be performed. For example, referring to FIG. 6, an operation for disposing the switch adjustment unit WMIV in the front-end cell region FC may be performed.

In the operation S244, the power rails may be disposed. As described above with reference to FIG. 6, the power rails may be separated from each other in the first direction X, and extend in the second direction Y. The power rails may be discontinued at the boundary between the front-end cell region FC and the back-end cell region BC. The power rails in the back-end cell region BC may be disposed to continuously extend in the second direction Y.

In an operation S260, an operation for generating output data may be performed. The output data may refer to data defining the layout of the integrated circuit, and include the layout data D14 described above with reference to FIG. 11. The output data may define the layout of the integrated circuit in which I/O patterns, which include the second number of active regions for every bitcell pattern including the first number of bitcells, are disposed.

Figure 13:
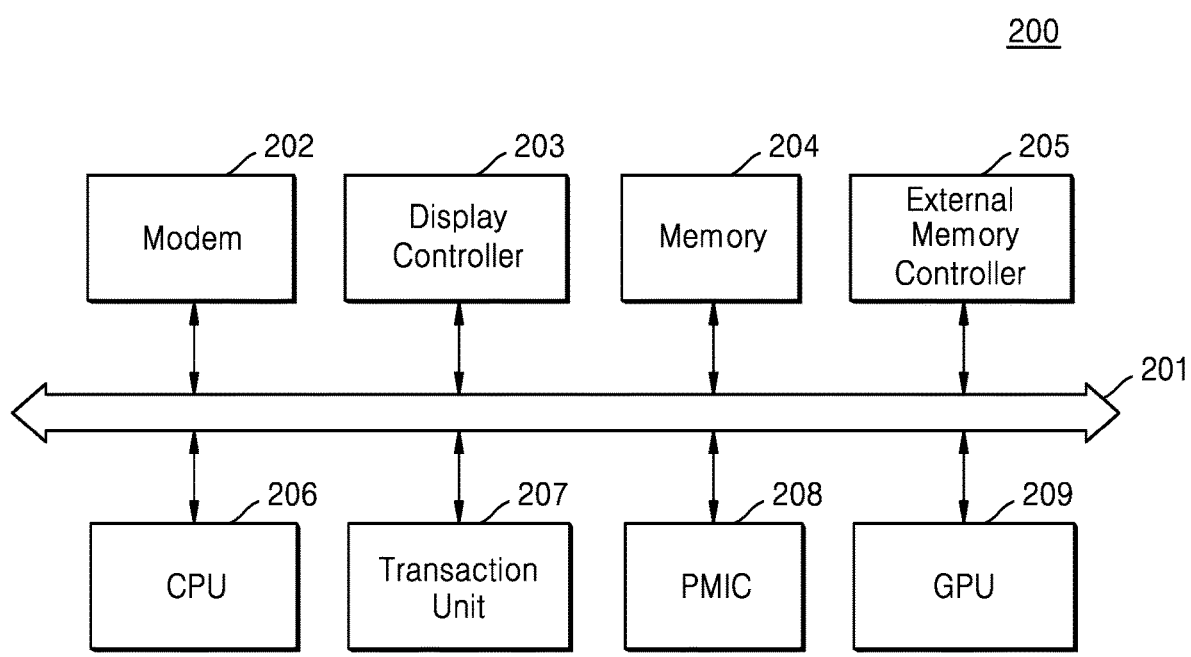
FIG. 13 is a block diagram showing a system on chip (SoC), according to an embodiment.

FIG. 13 is a block diagram showing a system on chip (SOC), according to an embodiment. An SOC 200 is a semiconductor device and may include an integrated circuit according to an embodiment. The SOC 200 implements complex function blocks such as intellectual property (IP), which performs various functions, in one chip, and the active regions, the logic cells, and the power rails disposed according to embodiments may be respectively included in the functional blocks of the SOC 200.

Referring to FIG. 13, the SOC 200 may include a modem 202, a display controller 203, a memory 204, an external memory controller 205, a central processing unit (CPU) 206, a transaction unit 207, a power management integrated circuit (PMIC) 208, and a graphics processing unit (GPU) 209, and the functional blocks of the SOC 200 may communicate with each other through a system bus 201.

The CPU 206, which may entirely control the operation of the SOC 200, may control the operations of other functional blocks, that is, the modem 202, the display controller 203, the memory 204, the external memory controller 205, the CPU 206, a transaction unit 207, the PMIC 208, and the GPU 209. The modem 202 may demodulate a signal received externally or modulate a signal generated internally to transmit the modulated signal externally. The external memory controller 205 may control operations for transmitting and receiving data to and from an external memory device connected to the SOC 200. For example, a program and/or data stored in the external memory device may be provided to the CPU 206 or the GPU 209 under the control of the external memory controller 205. The GPU 209 may execute program instructions related to graphic processing. The GPU 209 may receive graphic data through the external memory controller 205, and transmit graphic data processed by the GPU 209 outside the SOC 200 through the external memory controller 205. The transaction unit 207 may monitor data transactions of each of the functional blocks, and the PMIC 208 may control power supplied to each of the functional blocks according to a control by the transaction unit 207. The display controller 203 may control a display (or a display device) outside the SOC 200 to transmit data generated inside the SOC 200 to the display.

The memory 204 may include a non-volatile memory such as electrically erasable programmable read-only memory (EEPROM), flash memory, phase change random access memory (PRAM), RRAM, nano floating gate memory (NFGM), polymer random access memory (PoRAM), magnetic random access memory (MRAM), or ferroelectric random access memory (FRAM), and a volatile memory such DRAM, SRAM, mobile DRAM, double data rate synchronous dynamic random access memory (DDR SDRAM), low power DDR(LPDDR) SDRAM, graphic DDR (GDDR) SDRAM, or Rambus dynamic random access memory (RDRAM).

Figure 14:
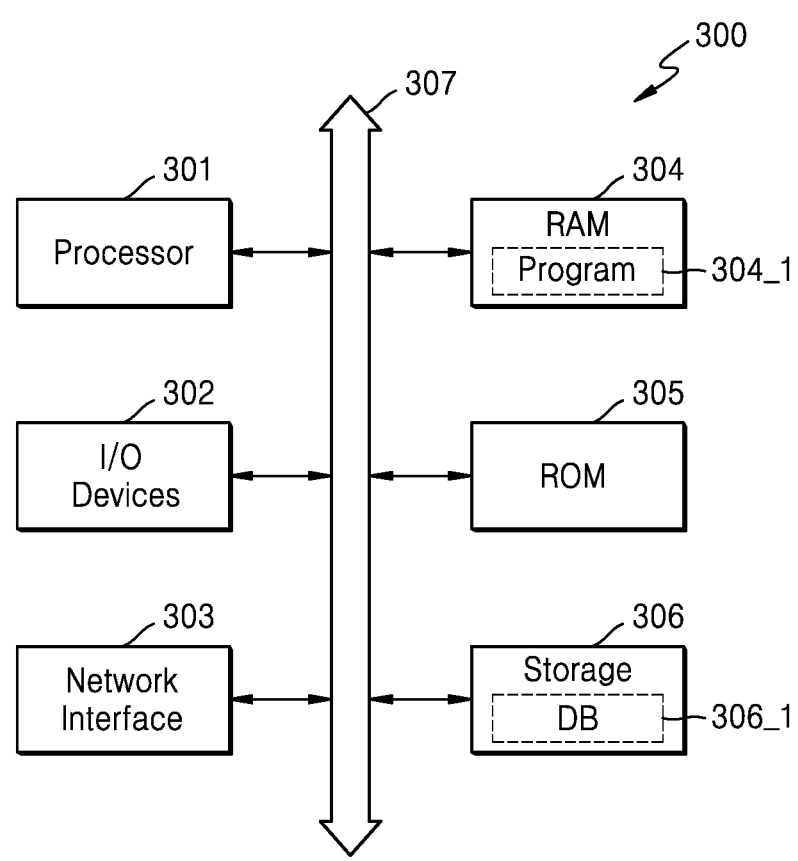
FIG. 14 is a block diagram showing a computing system including a memory for storing a program, according to an embodiment.

FIG. 14 is a block diagram showing a computing system including a memory for storing a program, according to an embodiment. At least some of the operations included in a method (e.g., the method of FIG. 11) of fabricating an integrated circuit, and operations included in a method (e.g., the method of FIG. 11) of designing an integrated circuit may be executed by a computing system 300.

The computing system 300 may be a stationary-type computing system such as a desktop computer, a workstation, or a server, or a portable computing system such as a laptop computer. As illustrated in FIG. 14, the computing system 300 may include a processor 301, I/O devices 302, a network interface 303, a RAM 304, ROM 305, and a storage device 306. The processor 301, the I/O devices 302, the network interface 303, the RAM 304, the ROM 305, and the storage device 306 may be connected to a bus 307, or communicate with each other through the bus 307.

The processor 301 may be referred to as a processing unit, and include at least one core such as a microprocessor, an application processor (AP), a digital signal processor (DSP), or a GPU, which is capable of executing an arbitrary instruction set (e.g., Intel Architecture (IA)-32), 64-bit extension IA-32, x86-64, PowerPC, Sparc, MIPS, ARM, IA-64, etc.). For example, the processor 301 may access the memory, namely, the RAM 304 or the ROM 305, through the bus 307, and execute instructions stored in the RAM 304 or the ROM 305.

The RAM 304 may store a program 304_1 or at least a portion thereof for fabricating an integrated circuit according to an embodiment, and the program 304_1 enables the processor 301 to execute at least a portion of operations for fabricating an integrated circuit or operations included in the method of designing the integrated circuit. In other words, the program 304_1 may include a plurality of instructions executable by the processor 301, and the instructions included in the program 304_1 enable the processor 301 to execute at least a portion of operations included in the flowchart described above with reference to, for example, FIGS. 8 and 9.

The storage device 306 may not lose the stored data, even when the power supplied to the computing system 300 is cut off. For example, the storage device 306 may include a non-volatile memory device, or a storage medium such as magnetic tape, an optical disc, or a magnetic disc. In addition, the storage device 306 may detachably attached to the computing system 300. The storage device 306 may store the program 304_1 according to an embodiment, and the program 304_1 or at least a portion thereof may be loaded to the RAM 304 from the storage device 306 before the program 304_1 is executed by the processor 301. Alternatively, the storage device 306 may store a file created in a program language, or the program 304_1 or at least a portion thereof, which is created by a compiler from the file, may be loaded to the RAM 304. In addition, the storage device 306 may store a database 306_1, and the database 306_1 may include information required to design the integrated circuit, for example, the standard cell library D12 of FIG. 11.

The storage device 306 may store data processed or to be processed by the processor 301. In other words, according to the program 304_1, the processor 301 may generate data by processing data stored in the storage device 306, or store the generated data to the storage device 306. For example, the storage device 306 may store the RTL data D11, the netlist data D13, and/or the layout data D14 of FIG. 11.

The I/O devices 302 may include an input device such as a keyboard or a pointing device, and an output device such as a display device or a printer. For example, through the I/O devices 302, a user may trigger execution of the program 304_1 through the processor 301, input the RTL data D11 and/or the netlist data D13 of FIG. 11, and also check the layout data D14 of FIG. 11.

The network interface 303 may provide access to a network outside the computing system 300. For example, the network may include a plurality of computing systems and communication links, and the communication links may include wired links, optical links, wireless links, or arbitrary types of links.

While the inventive concept has been particularly shown and described with reference to embodiments thereof, it will be understood that various changes in form and details may be made therein without departing from the spirit and scope of the following claims.

What is claimed is:
1. An integrated circuit comprising:
a memory cell block comprising a plurality of bitcells; and
an input and output (I/O) block comprising a plurality of gate-all-around (GAA) transistors connected to the bitcells,
wherein the I/O block comprises:
a plurality of active regions disposed separately from one another in a first direction, each of which extends in a second direction that is vertical to the first direction, and in which the GAA transistors are formed;
a plurality of power rails disposed separately from one another in the first direction, and configured to provide power to the GAA transistors; and
a plurality of signal lines disposed between the power rails, and configured to provide signals to the GAA transistors, wherein a first number of bitcells among the bitcells are connected to the GAA transistors formed in a second number of active regions among the active regions, and
wherein the second number is greater than twice the first number.

2. The integrated circuit according to claim 1, wherein the second number is three times the first number, and
wherein every two of the active regions are disposed between the power rails.

3. The integrated circuit according to claim 1, wherein the I/O block comprises:
a front-end cell region adjacent to the memory cell block in the second direction; and
a back-end cell region adjacent to the front-end cell region in the second direction,
wherein the power rails are formed to be discontinued at a boundary of the front-end cell region and the back-end cell region.

4. The integrated circuit according to claim 3, wherein the front-end cell region comprises logic cells having a bilaterally symmetric layout.

5. The integrated circuit according to claim 3, wherein the front-end cell region comprises:
a switch adjustment unit disposed adjacent to the memory cell block in the second direction, and configured to invert a write signal; and
a write switch disposed adjacent to the switch adjustment unit in the second direction, and configured to deliver write data to a bitline connected to at least one of the bitcells.

6. The integrated circuit according to claim 3, wherein at least one of the power rails is disposed to be continued in the second direction in the back-end cell region.

7. The integrated circuit according to claim 1, wherein the active regions comprise:
a first active region group comprising a second number of active regions; and
a second active region group disposed adjacent to the first active region group and comprising a second number of active regions,
wherein the power rails and the signal lines comprise:
a first power rail group and a first signal line group formed on the first active region group; and
a second power rail group and a second signal line group formed on the second active region group;
wherein a layout of the first active region group is the same as that of the second active region group,
wherein a layout of the first power rail group is the same as that of the second power rail group, and
wherein a layout of the first signal line group is the same as that of the second signal line group.

8. The integrated circuit according to claim 1, further comprising:
a first via connected to the signal lines; and
a second via connected to the power rails,
wherein a size of the first via is smaller than that of the second via.

9. The integrated circuit according to claim 1, wherein the GAA transistors comprise multi-bridge channel type transistors.

10. The integrated circuit according to claim 1, wherein the bitcells comprise static random access memory (SRAM) bitcells.

11. An integrated circuit comprising:
a first number of bitcells disposed in a first direction; and a front-end cell region configured to correspond to the first number of bitcells, and adjacent to the first number of bitcells in a second direction that is vertical to the first direction, wherein the front-end cell region comprises:
- a second number of active regions separated from one another in the first direction, each of which extends in the second direction;
- a plurality of logic cells comprising gate-all-around (GAA) transistors formed in the active regions; and
- a plurality of power rails configured to provide power to the logic cells, wherein the second number is three times the first number.

12. The integrated circuit according to claim 11, wherein the logic cells are formed to have a bilaterally symmetric layout.

13. The integrated circuit according to claim 11, wherein each of the logic cells comprises:
- a switch adjustment unit disposed adjacent to the first number of bitcells in the second direction, and configured to invert a write signal; and
- a write switch disposed adjacent to the switch adjustment unit in the second direction, and configured to provide write data to a bitline connected to at least one of the bitcells.

14. An integrated circuit comprising:
- 4 bitcells disposed in a first direction;
- 12 active regions separated from one another in the first direction, extending in a second direction that is vertical to the first direction, and configured to correspond to the first number of bitcells;
- a plurality of logic cells comprising a plurality of multi-bridge channel type transistors formed in the 12 active regions;
- a front-end cell region comprising a plurality of logic cells disposed adjacent to the 4 bitcells in the second direction;
- a back-end cell region comprising a plurality of logic cells configured to adjacent to the logic cells in the front-end cell region in the second direction; and
- a plurality of power rails separated from one another in the first direction, each of which extends in the second direction and being formed to be discontinued at a boundary between the front-end cell region and the back-end cell region.

15. The integrated circuit according to claim 14, wherein the front-end cell region comprises:
- a switch adjustment unit disposed adjacent to the 4 bitcells in the second direction, and configured to invert a write signal; and
- a plurality of write switches disposed adjacent to the switch adjustment unit in the second direction, and configured to provide write data to a bitline connected to at least one of the bitcells.

16. The integrated circuit according to claim 15, wherein the front-end cell region further comprises a plurality of power gating cells configured to supply power to 4 bitcells, and wherein the power gating cells are disposed adjacent to the switch adjustment unit in the second direction, and to the write switch in the first direction.

17. The integrated circuit according to claim 14, wherein the logic cells are formed to have a bilaterally symmetric layout.

18. The integrated circuit according to claim 14, wherein every two of the active regions are disposed between the power rails in the back-end cell region.

19. The integrated circuit according to claim 14, wherein the 4 bitcells and the 12 active regions are repetitively disposed in the first direction.

20. The integrated circuit according to claim 14, where the 4 bitcells comprise static random access memory (SRAM) bitcells.

* * * * *